(12) United States Patent
Takamine

(10) Patent No.: US 10,972,072 B2
(45) Date of Patent: Apr. 6, 2021

(54) COMPOSITE MULTIPLEXER

(71) Applicant: Murata Manufacturing Co., Ltd., Nagaokakyo (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 16/299,207

(22) Filed: Mar. 12, 2019

(65) Prior Publication Data

US 2019/0288670 A1 Sep. 19, 2019

(30) Foreign Application Priority Data

Mar. 14, 2018 (JP) .............................. JP2018-046262
Feb. 14, 2019 (JP) .............................. JP2019-024622

(51) Int. Cl.
| | |
|---|---|
| *H03H 9/64* | (2006.01) |
| *H03H 9/02* | (2006.01) |
| *H03H 9/145* | (2006.01) |
| *H03H 7/38* | (2006.01) |
| *H03H 9/05* | (2006.01) |
| *H01L 41/04* | (2006.01) |
| *H03H 9/72* | (2006.01) |
| *H03H 9/25* | (2006.01) |

(52) U.S. Cl.
CPC ........... *H03H 9/6483* (2013.01); *H01L 41/04* (2013.01); *H03H 7/38* (2013.01); *H03H 9/02559* (2013.01); *H03H 9/058* (2013.01); *H03H 9/145* (2013.01); *H03H 9/725* (2013.01); *H03H 9/25* (2013.01)

(58) Field of Classification Search
CPC .. H03H 9/6483; H03H 9/02559; H03H 9/058; H03H 9/145; H03H 9/725; H03H 9/25; H03H 7/38; H01L 41/04
See application file for complete search history.

(56) References Cited

U.S. PATENT DOCUMENTS

| | | | |
|---|---|---|---|
| 2012/0274417 A1* | 11/2012 | Kihara ................. | H04B 1/0057 333/133 |
| 2013/0234806 A1 | 9/2013 | Schmidhammer et al. | |
| 2014/0049337 A1 | 2/2014 | Schmidhammer | |
| 2016/0126443 A1* | 5/2016 | Barfknecht .......... | H03H 9/1071 310/313 R |
| 2017/0126198 A1 | 5/2017 | Mukai | |
| 2017/0338801 A1* | 11/2017 | Hey-Shipton ........ | H03H 9/6489 |
| 2018/0205362 A1 | 7/2018 | Kishimoto et al. | |
| 2019/0074813 A1* | 3/2019 | Zou ..................... | H03H 9/02228 |
| 2020/0021274 A1* | 1/2020 | Wagner ................. | H03H 9/542 |

FOREIGN PATENT DOCUMENTS

| | | |
|---|---|---|
| JP | 2013-545325 A | 12/2013 |
| JP | 2014-511626 A | 5/2014 |
| JP | 2015-159546 A | 9/2015 |
| JP | 2017-092546 A | 5/2017 |
| WO | 2017/068827 A1 | 4/2017 |

\* cited by examiner

*Primary Examiner* — Samuel S Outten
(74) *Attorney, Agent, or Firm* — Keating & Bennett, LLP

(57) ABSTRACT

A composite multiplexer includes a first multiplexer, a second multiplexer, and a second LC circuit. The first multiplexer includes first band pass filter circuits and first LC circuits connected to end portions of the first band pass filter circuits that are opposite to a first terminal, respectively. The second multiplexer includes second band pass filter circuits. The second LC circuit is connected between the first terminal and the second multiplexer.

20 Claims, 12 Drawing Sheets

COMPOSITE MULTIPLEXER

CROSS REFERENCE TO RELATED APPLICATION

This application claims the benefit of priority to Japanese Patent Application No. 2018-046262 filed on Mar. 14, 2018 and Japanese Patent Application No. 2019-024622 filed on Feb. 14, 2019. The entire contents of these applications are hereby incorporated herein by reference.

BACKGROUND OF THE INVENTION

1. Field of the Invention

The present invention relates to a composite multiplexer in mobile communication devices or other suitable devices.

2. Description of the Related Art

In 5G, which is the next-generation communication standards, frequency bands of about 3 GHz to about 6 GHz are used. Therefore, band pass filters that are able to be used in those frequency bands are required. Japanese Unexamined Patent Application Publication No. 2017-092546 discloses an inductor-capacitor (LC) filter for use in those frequency bands.

The LC filter is insufficient in steepness. Therefore, the LC filter is inappropriate for a multiplexer for carrier aggregation in the 5G communication standards.

Acoustic wave filters have excellent steepness of filter characteristics. Particularly in a case of an acoustic wave filter that uses an S0 mode of plate waves, the frequency is able to be increased easily. For example, in an acoustic wave filter described in WO 2017/068827, an acoustic multilayer film and a piezoelectric film are stacked on a support substrate. In the S0 mode of plate waves that propagate along the piezoelectric film, the acoustic velocity is as high as about 6000 m/sec. Therefore, there is no need to significantly reduce the line widths of electrode fingers or gaps between the electrode fingers even for use in the bands of about 3 GHz to about 6 GHz. Thus, problems of variations in production, a decrease in electric power handling capability, or other problems do not arise even in high-frequency bands.

When a multiplexer is constructed using filters having pass bands of about 3 GHz to about 6 GHz, a new problem arises in that an isolation characteristic between the filters is insufficient. A possible reason for this is that an influence of residual inductance or stray capacitance is more significant at a high frequency than at a low frequency.

SUMMARY OF THE INVENTION

Preferred embodiments of the present invention provide composite multiplexers that each have excellent isolation characteristics even when a frequency is increased.

A composite multiplexer according to a preferred embodiment of the present invention includes a first terminal, a plurality of second terminals, a first multiplexer, a second multiplexer, and a second LC circuit. The first terminal is to be connected to an antenna terminal. The plurality of second terminals define and function as input/output terminals. The first multiplexer includes a plurality of band pass filter circuits including one-side ends connected to the first terminal, and a plurality of first LC circuits connected to the plurality of band pass filter circuits, respectively. The first multiplexer is structured such that end portions of the band pass filter circuits that are opposite to the first terminal are connected to the plurality of second terminals with the first LC circuits interposed therebetween, respectively. The second multiplexer includes a plurality of band pass filter circuits including one-side ends connected to the first terminal. The second multiplexer is structured such that end portions of the band pass filter circuits that are opposite to the first terminal are connected to the plurality of second terminals, respectively. The second LC circuit is connected between the first terminal and the second multiplexer.

In a composite multiplexer according to a preferred embodiment of the present invention, the plurality of first LC circuits may define attenuation poles defining pass bands of the band pass filter circuits. In this case, the steepness of filter characteristics of the first multiplexer is able to be increased effectively.

In a composite multiplexer according to a preferred embodiment of the present invention, the second LC circuit may be a 90-degree delay circuit to delay a phase of a signal to be propagated by about 90 degrees. In this case, the phases are able to be varied by about 90 degrees between signals propagated through the first multiplexer and the second multiplexer.

In a composite multiplexer according to a preferred embodiment of the present invention, each of the first LC circuits may be a 90-degree delay circuit to delay a phase of a signal to be propagated by about 90 degrees. In this case, the isolation characteristics are able to be further improved.

In a composite multiplexer according to a preferred embodiment of the present invention, at least one of the band pass filter circuits is an acoustic wave filter. In this case, the frequency is able to be easily increased.

In a composite multiplexer according to a preferred embodiment of the present invention, the first multiplexer is a first duplexer and the second multiplexer is a second duplexer.

In a composite multiplexer according to a preferred embodiment of the present invention, one of the band pass filter circuits of the first multiplexer and one of the band pass filter circuits of the second multiplexer are band pass filter circuits for an identical band, and another one of the band pass filter circuits of the first multiplexer and another one of the band pass filter circuits of the second multiplexer are band pass filter circuits for another identical band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

It is to be noted that the preferred embodiments described herein are illustrative and structures may partially be replaced or combined between different preferred embodiments.

Figure 1:
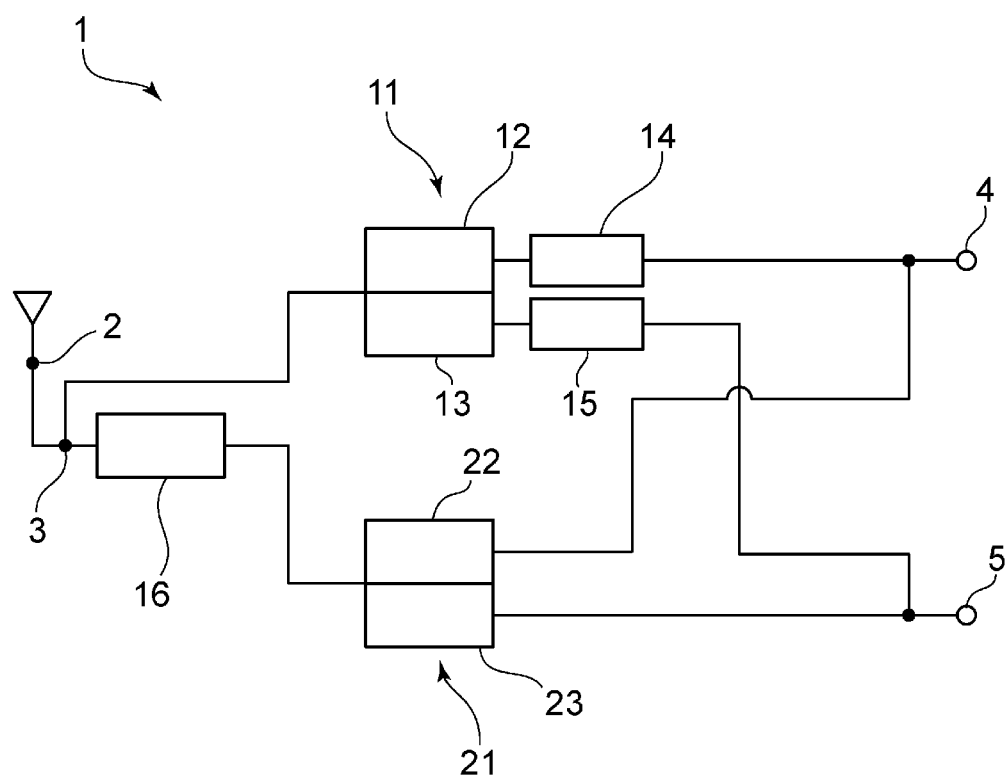
FIG. 1 is a circuit diagram of a composite multiplexer according to a first preferred embodiment of the present invention.

FIG. 1 is a circuit diagram of a composite multiplexer according to a first preferred embodiment of the present invention. A composite multiplexer 1 includes a first terminal 3 connected to an antenna terminal 2. The composite multiplexer 1 further includes a plurality of second terminals 4 and 5. The second terminals 4 and 5 define and function as input/output terminals. A first duplexer 11 defining and functioning as a first multiplexer is connected to the first terminal 3. A second duplexer 21 defining and functioning as a second multiplexer is connected to the first terminal 3 with a second LC circuit 16 interposed therebetween.

The composite multiplexer 1 is preferably used in, for example, Band 77 and Band 79 for 5G. The communication band of Band 77 is about 3300 MHz to about 4200 MHz. The communication band of Band 79 is about 4400 MHz to about 5000 MHz. The composite multiplexer 1 is used for carrier aggregation and therefore one-side ends of the first and second duplexers 11 and 21 are connected to the first terminal 3 in common. The second terminal 4 is defines and functions as an input/output terminal for Band 77. The second terminal 5 defines and functions as an input/output terminal for Band 79.

The composite multiplexer of the present preferred embodiment is not limited to the combination of Band 77 and Band 79, and is applicable to various combinations of bands.

The first duplexer 11 includes a plurality of band pass filter circuits 12 and 13. The band pass filter circuit 12 is for Band 77. The band pass filter circuit 13 is for Band 79. One-side ends of the plurality of band pass filter circuits 12 and 13 are connected to the first terminal 3 in common. In the first duplexer 11, a first LC circuit 14 is connected between the band pass filter circuit 12 and the second terminal 4. The first LC circuit 14 defines a pass band of Band 77 together with the band pass filter circuit 12. In particular, the first LC circuit 14 defines an attenuation pole to increase the steepness of the pass band of Band 77.

Similarly, a first LC circuit 15 is connected between the band pass filter circuit 13 and the second terminal 5. The first LC circuit 15 defines an attenuation pole. Thus, the band pass filter circuit 13 and the first LC circuit 15 increase the steepness of a pass band of Band 79.

As described above, in the first duplexer 11, the end portions of the plurality of band pass filter circuits 12 and 13 that are opposite to the end portions connected to the first terminal 3 are connected to the plurality of second terminals 4 and 5 with the first LC circuits 14 and 15 interposed therebetween, respectively.

In the present preferred embodiment, the first LC circuit 14 also delays a phase by about 90 degrees. Similarly, the first LC circuit 15 delays a phase of a signal to be propagated by about 90 degrees.

The second duplexer 21 includes a plurality of band pass filter circuits 22 and 23. The band pass filter circuit 22 is preferably for Band 77, for example. The band pass filter circuit 23 is preferably for Band 79, for example. One-side ends of the band pass filter circuit 22 and the band pass filter circuit 23 are connected to the first terminal 3 in common with the second LC circuit 16 interposed therebetween. The end portion of the band pass filter circuit 22 that is opposite to the end portion connected to the first terminal 3 is connected to the second terminal 4 for Band 77. The end portion of the band pass filter circuit 23 that is opposite to the end portion connected to the first terminal 3 is connected to the second terminal 5 that is a transmission/reception terminal for Band 79.

The second LC circuit 16 delays a phase of a signal to be propagated by about 90 degrees. That is, the second LC circuit 16 is a 90-degree delay circuit similarly to the first LC circuits 14 and 15.

Since the composite multiplexer 1 is configured as described above, an isolation characteristic between Band 77 and Band 79 is able to be effectively improved. This advantage is described later in more detail with respect to an example of a preferred embodiment of the present invention.

Figure 2:
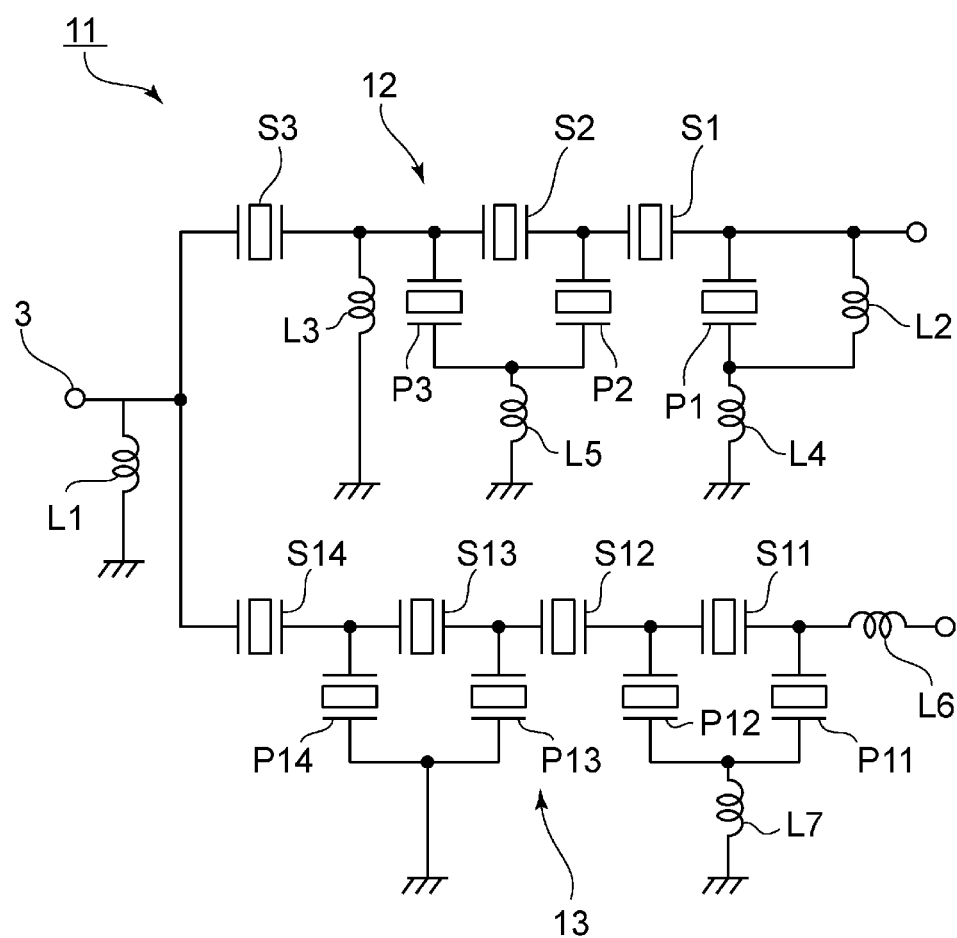
FIG. 2 is a circuit diagram illustrating the structures of band pass filter circuits of a first duplexer in the composite multiplexer illustrated in FIG. 1.

FIG. 2 is a circuit diagram for describing the circuit structures of the band pass filter circuits 12 and 13 of the first duplexer 11 in the composite multiplexer 1. The band pass filter circuits 22 and 23 of the second duplexer have the same or similar circuit structures.

FIG. 2 illustrates a portion of the first duplexer 11 that is located closer to the first terminal 3 relative to the first LC circuits 14 and 15. FIG. 2 does not illustrate the first LC circuits 14 and 15.

As illustrated in FIG. 2, one-side ends of the band pass filter circuit 12 and the band pass filter circuit 13 are connected to the first terminal 3 in common. An inductor L1 providing impedance matching is connected between the first terminal 3 and a ground potential.

The band pass filter circuit 12 and the band pass filter circuit 13 are preferably ladder filters, for example. In the band pass filter circuit 12, a plurality of series arm resonators S1 to S3 and a plurality of parallel arm resonators P1 to P3 are connected to each other so as to define the ladder circuit.

An inductor L4 is connected between the parallel arm resonator P1 and the ground potential. An inductor L2 is connected between the series arm and a connection point between the parallel arm resonator P1 and the inductor L4.

An inductor L3 is connected between the ground potential and a connection point between the series arm resonators S2 and S3. One-side ends of the parallel arm resonators P2 and P3 are connected to each other in common and are connected to the ground potential with an inductor L5 interposed therebetween.

In the band pass filter circuit 13, a plurality of series arm resonators S11 to S14 and a plurality of parallel arm resonators P11 to P14 are connected to each other so as to define the ladder circuit. One-side ends of the parallel arm resonators P11 and P12 are connected to each other in common and are connected to the ground potential. One-side ends of the parallel arm resonators P13 and P14 are also connected to each other in common and are connected to the ground potential. An inductor L6 is connected to the series arm resonator S11 at a portion opposite to the first terminal 3. An inductor L7 is connected between the ground potential and a portion at which the parallel arm resonators P11 and P12 are connected to each other in common.

In the band pass filter circuit 12, the inductor L2 and the inductor L3 are connected to define attenuation poles outside the pass band. The inductor L4 and the inductor L5 are connected to increase a frequency interval between a resonant frequency and an anti-resonant frequency of the parallel arm resonator.

In the band pass filter circuit 13, the inductor L6 is connected to provide impedance matching with the second terminal 5 illustrated in FIG. 1. The inductor L7 is connected to define an attenuation pole outside the pass band.

The band pass filter circuit 22 and the band pass filter circuit 23 of the second duplexer 21 are configured the same as or similar to the band pass filter circuit 12 and the band pass filter circuit 13.

Referring to FIG. 1, in the composite multiplexer, the first LC circuit 14 is connected to the band pass filter circuit 12 and the first LC circuit 15 is connected to the band pass filter circuit 13 to further define attenuation poles outside the bands. Thus, the steepness of filter characteristics are further increased.

Each of the series arm resonators S1 to S3, the parallel arm resonators P1 to P3, the series arm resonators S11 to S14, and the parallel arm resonators P11 to P14 illustrated in FIG. 2 is preferably an acoustic wave resonator, for example. Thus, each of the band pass filter circuit 12, the band pass filter circuit 13, the band pass filter circuit 22, and the band pass filter circuit 23 is preferably a ladder acoustic wave filter circuit, for example.

Figure 3:
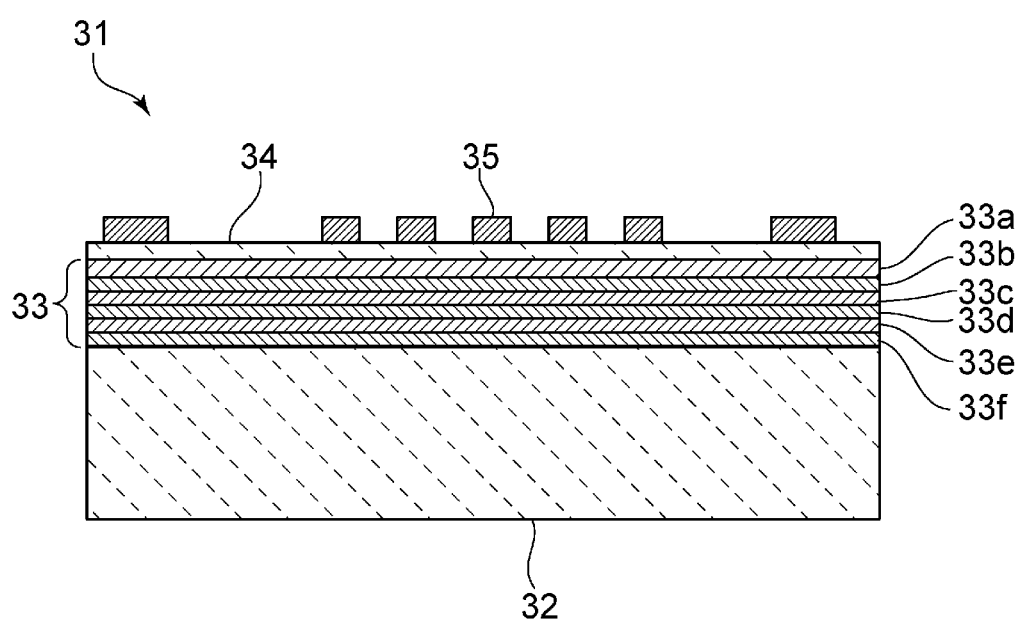
FIG. 3 is an elevational cross-sectional view for describing an acoustic wave resonator that defines an acoustic wave filter for use in the composite multiplexer according to the first preferred embodiment of the present invention.

FIG. 3 is an elevational cross-sectional view illustrating an example of an acoustic wave resonator according a preferred embodiment of the present invention. An acoustic wave resonator 31 includes a support substrate 32. An acoustic multilayer film 33 is stacked on the support substrate 32. A piezoelectric plate 34 is stacked on the acoustic multilayer film 33. An interdigital transducer (IDT) electrode 35 is provided on the piezoelectric plate 34. Reflectors are disposed on both sides of the IDT electrode 35 in an acoustic wave propagation direction. Illustration of the reflectors is omitted.

The support substrate 32 is made of any appropriate material, such as a semiconductor material including silicon or a piezoelectric material including silicon oxynitride, silicon nitride, or alumina, for example.

The acoustic multilayer film 33 includes low acoustic impedance layers 33a, 33c, and 33e and high acoustic impedance layers 33b, 33d, and 33f. The low acoustic impedance layers 33a, 33c, and 33e and the high acoustic impedance layers 33b, 33d, and 33f are alternately stacked on each other. The acoustic impedance of each of the low acoustic impedance layers 33a, 33c, and 33e is lower than the acoustic impedance of each of the high acoustic impedance layers 33b, 33d, and 33f. Any appropriate materials may be used for the low acoustic impedance layers 33a, 33c, and 33e and the high acoustic impedance layers 33b, 33d, and 33f as long as the relationship of magnitudes of acoustic impedance is satisfied. Examples of the materials include insulating materials, such as silicon oxide, silicon oxynitride, silicon nitride, and alumina, semiconductor materials such as silicon, and metals, such as Al, Pt, and an AlCu alloy.

The piezoelectric plate 34 is preferably made of any appropriate piezoelectric material, such as LiTaO$_3$ or LiNbO$_3$, for example. The IDT electrode 35 is also made of any appropriate metal or alloy. The IDT electrode 35 may include a laminated metal film.

In the composite multiplexer 1, each of the band pass filter circuits 12 and 13 and the band pass filter circuits 22 and 23 includes a plurality of acoustic wave resonators 31. Thus, the frequency is able to be easily increased by using an S0 mode of plate waves or other suitable plate wave, for example.

Figure 4A:
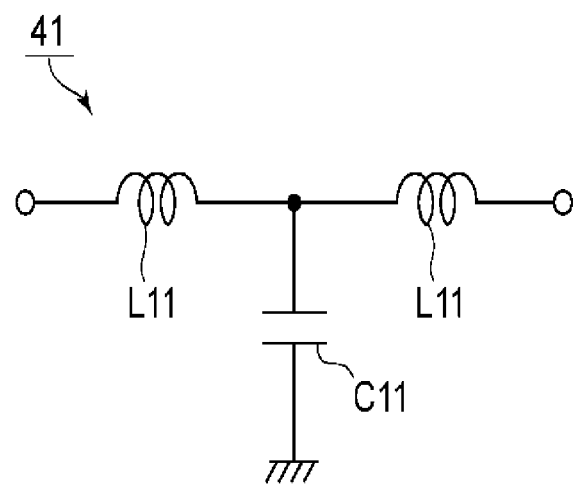
FIG. 4A is a circuit diagram illustrating an example of first and second LC circuits.
Figure 5A:
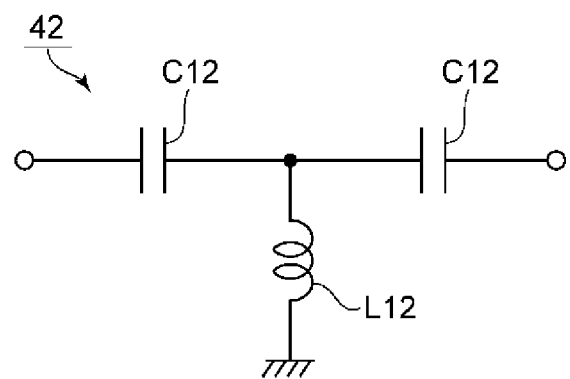
FIG. 5A is a circuit diagram illustrating another example of the first and second LC circuits.

Referring to FIG. 1, each of the first LC circuits 14 and 15 and the second LC circuit 16 includes an inductor L and a capacitor C connected to each other. FIG. 4A is a circuit diagram illustrating an example of the LC circuit. FIG. 5A is a circuit diagram illustrating another example thereof.

Figure 4B:
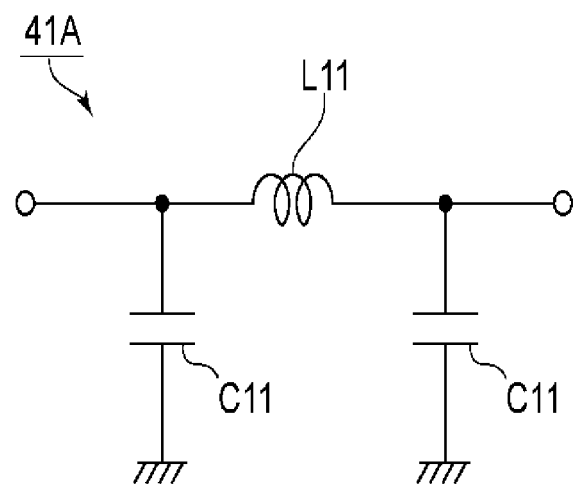
FIG. 4B is a circuit diagram illustrating another example of first and second LC circuits.

In an LC circuit 41 illustrated in FIG. 4A, an inductor L11 is connected to a transfer path to which an output terminal is connected. That is, the inductor L11 is connected in series to a series arm of a ladder filter. Capacitors C11 and C11 are connected between the transfer path and a ground potential. Here, an LC circuit 41A illustrated in FIG. 4B may be used in place of the LC circuit 41 illustrated in FIG. 4B.

Figure 5B:
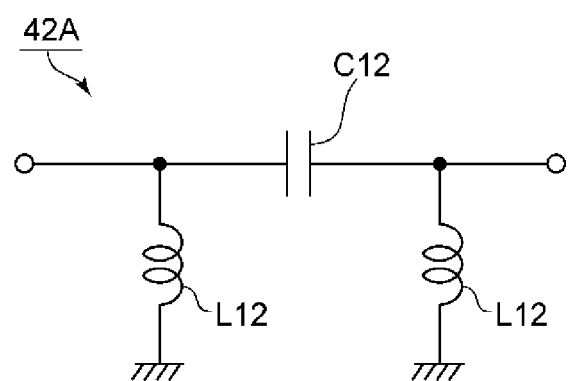
FIG. 5B is a circuit diagram illustrating another example of first and second LC circuits.

In an LC circuit 42 illustrated in FIG. 5A, a capacitor C12 is connected to a signal transfer path. Inductors L12 and L12 are connected between the signal transfer path and a ground potential. Here, an LC circuit 42A illustrated in FIG. 5B may be used in place of the LC circuit 42 illustrated in FIG. 5A.

Each of the first and second LC circuits 14, 15, and 16 described above is preferably defined by the LC circuit 41 or the LC circuit 42.

In the composite multiplexer 1, a transmission signal of Band 77 and a reception signal of Band 79 are transferred. In this case, the isolation characteristic is able to be effectively improved because the first and second LC circuits 14 to 16 are provided. This point is demonstrated by describing an example of a preferred embodiment of the present invention and a comparative example below.

The band pass filter circuit 12 of the first duplexer 11 in an example of the first preferred embodiment that was manufactured based on the following design parameters.

TABLE 1

| | | S1 | P1 | S2 | P2 | S3 | P3 |
|---|---|---|---|---|---|---|---|
| | | Band77 | | | | | |
| Wave length of IDT electrode | (μm) | 1.4835 | 1.9293 | 1.5145 | 1.9189 | 1.4984 | 1.8667 |
| Wave length of reflector | (μm) | 1.4835 | 1.9293 | 1.5145 | 1.9189 | 1.4984 | 1.8667 |
| Intersecting width | (μm) | 22.3 | 29.0 | 22.8 | 28.8 | 22.4 | 280.0 |
| Number of pairs of electrode fingers of IDT electrode | | 147 | 149 | 170 | 145 | 163 | 160 |
| Number of electrode fingers of reflector | | 21 | 21 | 21 | 21 | 21 | 21 |
| Duty Ratio | | 0.5 | 0.5 | 0.5 | 0.5 | 0.5 | 0.5 |
| Series division number | | 6 | 4 | 5 | 7 | 3 | 5 |

The band pass filter circuit 13 was constructed based on design parameters shown in Table 2.

TABLE 2

| | | P11 | S11 | P12 | S12 | P13 | S13 | P14 | S14 |
|---|---|---|---|---|---|---|---|---|---|
| | | Band79 | | | | | | | |
| Wave length of IDT electrode | (μm) | 1.4681 | 1.2670 | 1.4352 | 1.2739 | 1.4374 | 1.2816 | 1.4391 | 1.2397 |
| Wave length of reflector | (μm) | 1.4681 | 1.2670 | 1.4352 | 1.2739 | 1.4374 | 1.2816 | 1.4391 | 1.2397 |
| Intersecting width | (μm) | 22.0 | 19.0 | 21.5 | 19.1 | 21.5 | 19.3 | 21.6 | 18.6 |
| Number of pairs of electrode fingers of IDT electrode | | 152 | 138 | 149 | 163 | 137 | 134 | 152 | 157 |
| Number of electrode fingers of reflector | | 21 | 21 | 21 | 21 | 21 | 21 | 21 | 21 |
| Duty Ratio | | 0.5 | 0.5 | 0.5 | 0.5 | 0.5 | 0.5 | 0.5 | 0.5 |
| Series division number | | 5 | 5 | 4 | 5 | 6 | 3 | 4 | 6 |

The inductance values of the inductors L1 to L7 were set as shown in Table 3.

TABLE 3

| Inductance value | L1 | 6.9 nH |
|---|---|---|
| | L2 | 1.4 nH |
| | L3 | 0.9 nH |
| | L4 | 4.6 nH |
| | L5 | 0.8 nH |
| | L6 | 2.8 nH |
| | L7 | 0.6 nH |

The circuit structure of the LC circuit 41 illustrated in FIG. 4A was used as the circuit structure of each of the first and second LC circuits. The inductance value of the inductor L11 was set to about 1.9 nH, for example. The capacitance of the capacitor C11 was set to about 0.8 pF, for example.

The design parameters of the band pass filter circuits 22 and 23 of the second duplexer 21 were similarly set.

For comparison, a multiplexer circuit was constructed similarly to the preferred embodiment described above except that the first and second LC circuits 14 to 16 were not used and one-side ends of the first duplexer and the second duplexer were not connected to each other in common.

In the comparative example, the first and second duplexers were not connected in parallel to each other and, therefore, the electrostatic capacities of all of the resonators were doubled and the values of all of the inductances were halved compared with the example.

Figure 6:
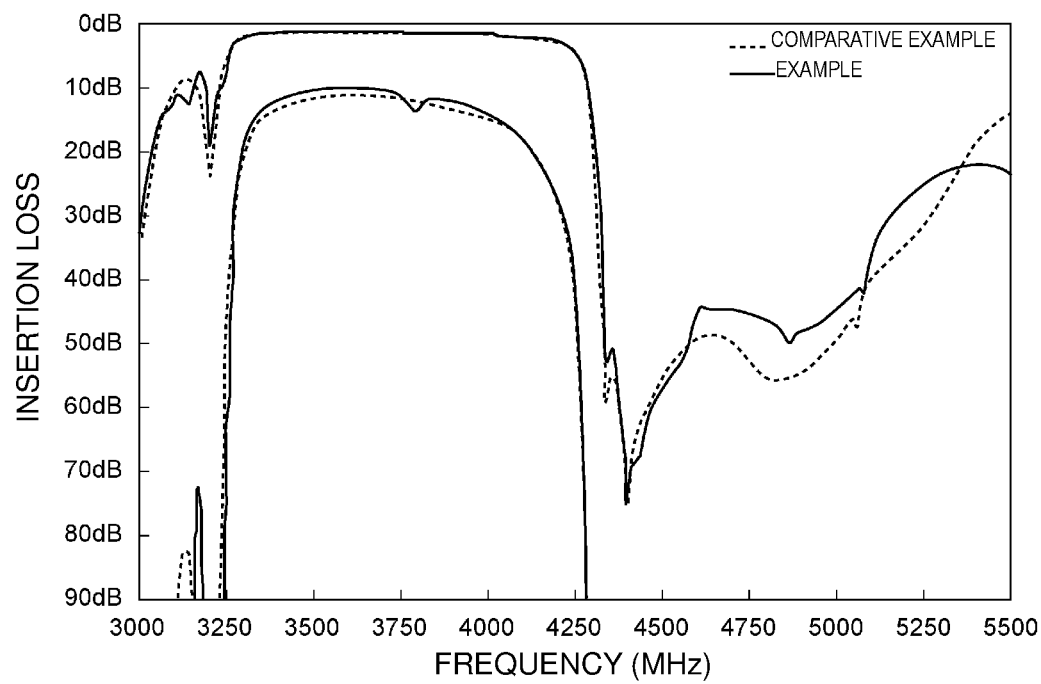
FIG. 6 is a diagram illustrating bandpass characteristics of Band 77 in a comparative example and an example of a preferred embodiment of the present invention.
Figure 7:
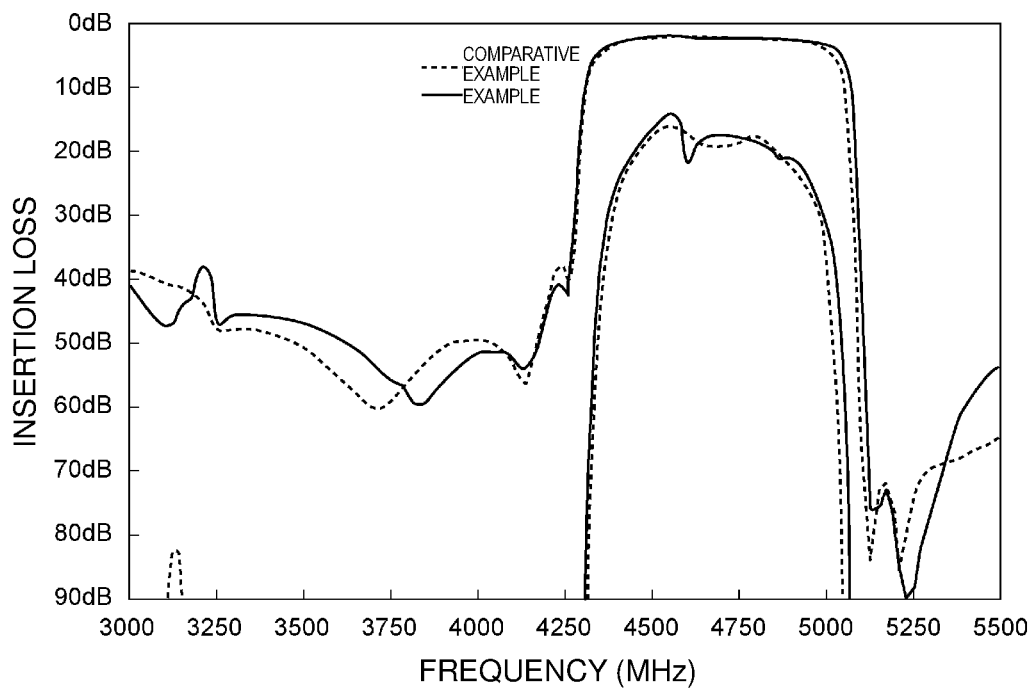
FIG. 7 is a diagram illustrating bandpass characteristics of Band 79 in the comparative example and the example.
Figure 8:
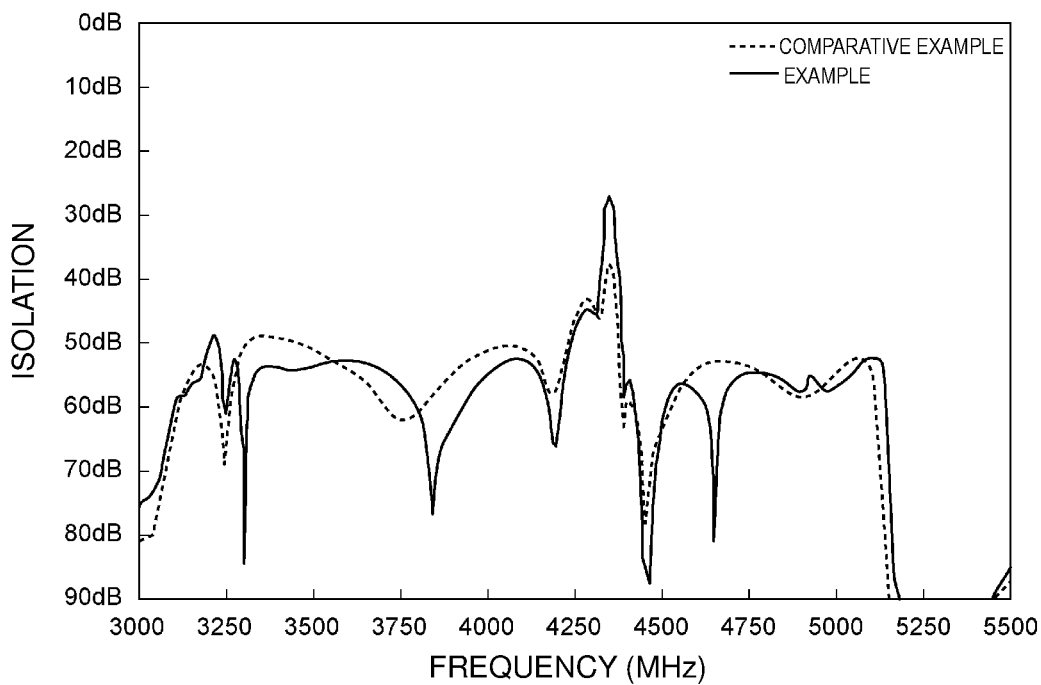
FIG. 8 is a diagram illustrating isolation characteristics from Band 77 to Band 79 in composite multiplexers of the comparative example and the example.
Figure 9:
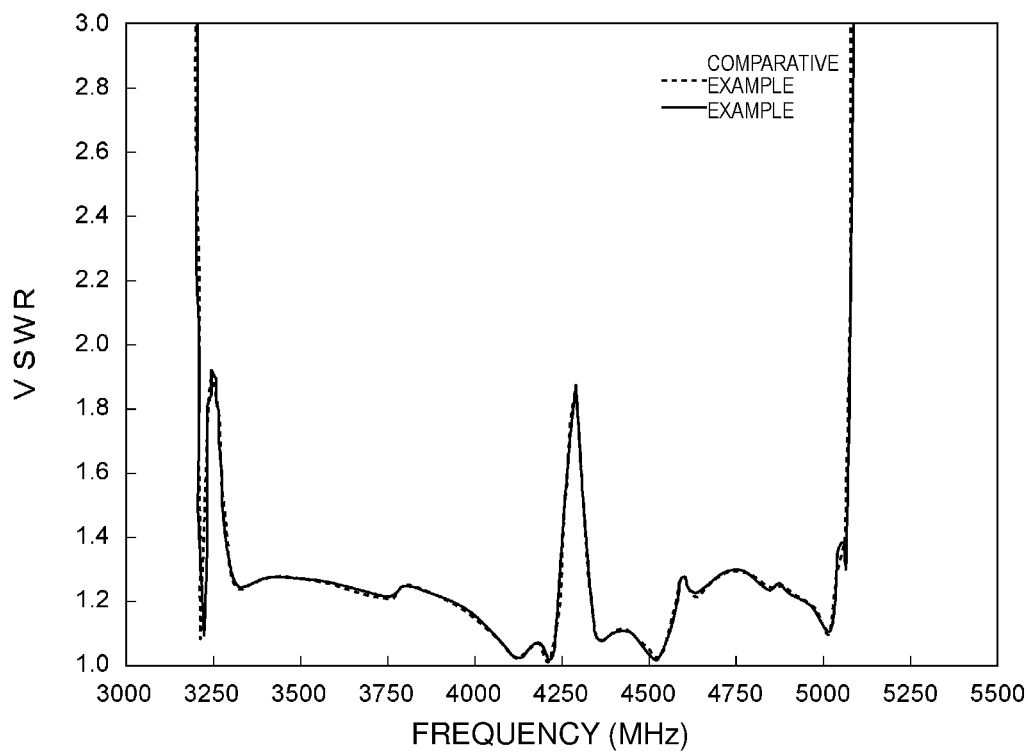
FIG. 9 is a diagram illustrating voltage standing wave ratio (VSWR) characteristics at an antenna terminal in the comparative example and the example.
Figure 10:
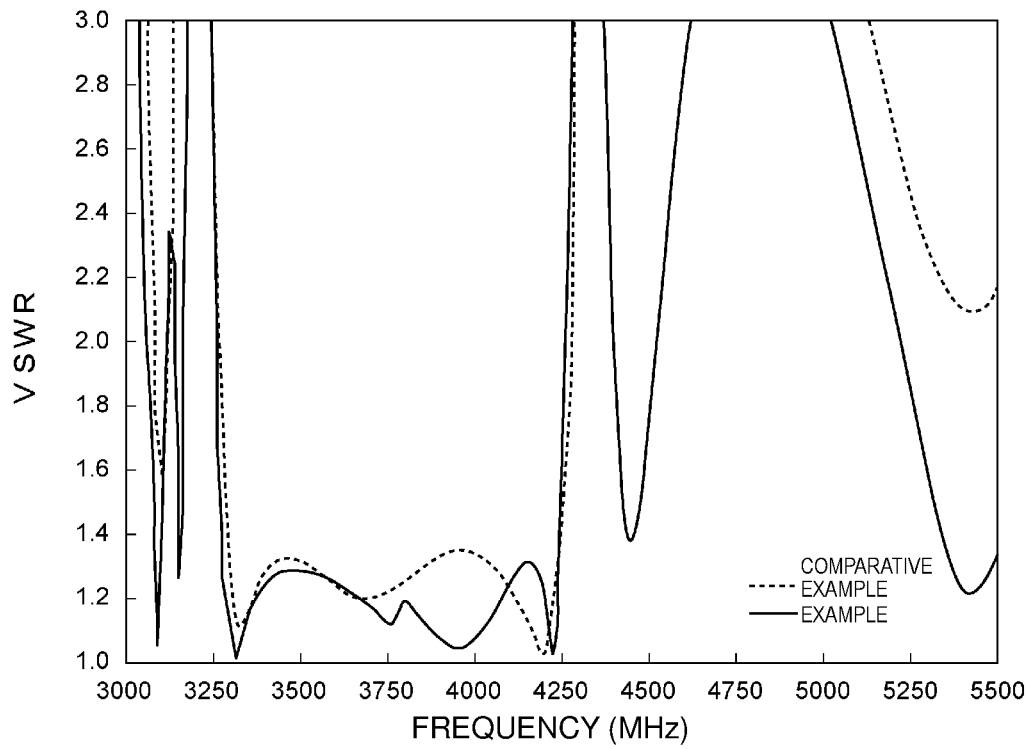
FIG. 10 is a diagram illustrating VSWR characteristics at a terminal for Band 77 in the comparative example and the example.
Figure 11:
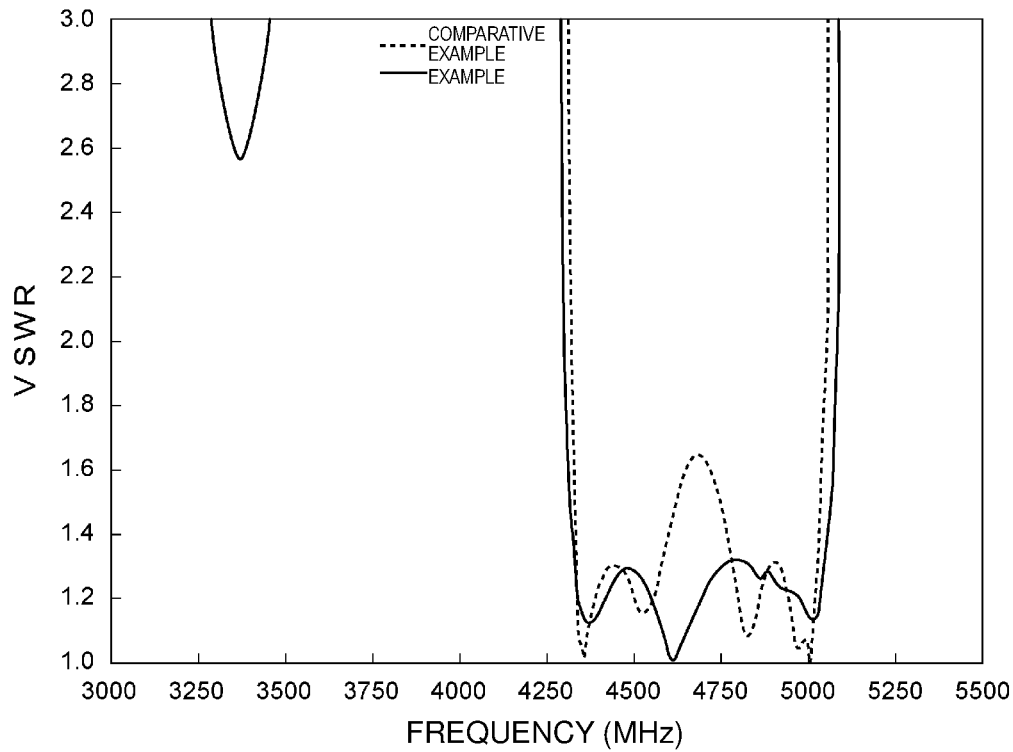
FIG. 11 is a diagram illustrating VSWR characteristics at a terminal for Band 79 in the comparative example and the example.

FIG. 6 illustrates bandpass characteristics of the transmission signal of Band 77. FIG. 7 illustrates bandpass characteristics of the reception signal of Band 79. FIG. 8 is a diagram illustrating isolation characteristics from Band 77 to Band 79. FIG. 9 is a diagram illustrating VSWR characteristics at the antenna terminal. FIG. 10 is a diagram illustrating VSWR characteristics at the terminal for Band 77. FIG. 11 is a diagram illustrating VSWR characteristics at the terminal for Band 79.

In FIG. 6 to FIG. 11, results of the example are indicated by solid lines and results of the comparative example are indicated by broken lines.

As illustrated in FIG. 8, the isolation characteristics are effectively improved in the example compared with the comparative example. That is, the isolation in Band 77 is improved in the example to about 52.2 dB compared with the isolation of about 48.6 dB in the comparative example. The isolation in Band 79 is improved in the example to about 54.2 dB compared with the isolation of about 52.4 dB in the comparative example.

As is apparent from FIG. 6 and FIG. 7, the bandpass characteristics of Band 77 and Band 79 are also improved in the example compared with the comparative example. As illustrated in FIG. 9 to FIG. 11, the VSWR characteristics are also improved in the example compared with the comparative example.

The reason why the isolation characteristic is improved in the example compared with the comparative example may be as follows.

Figure 12:
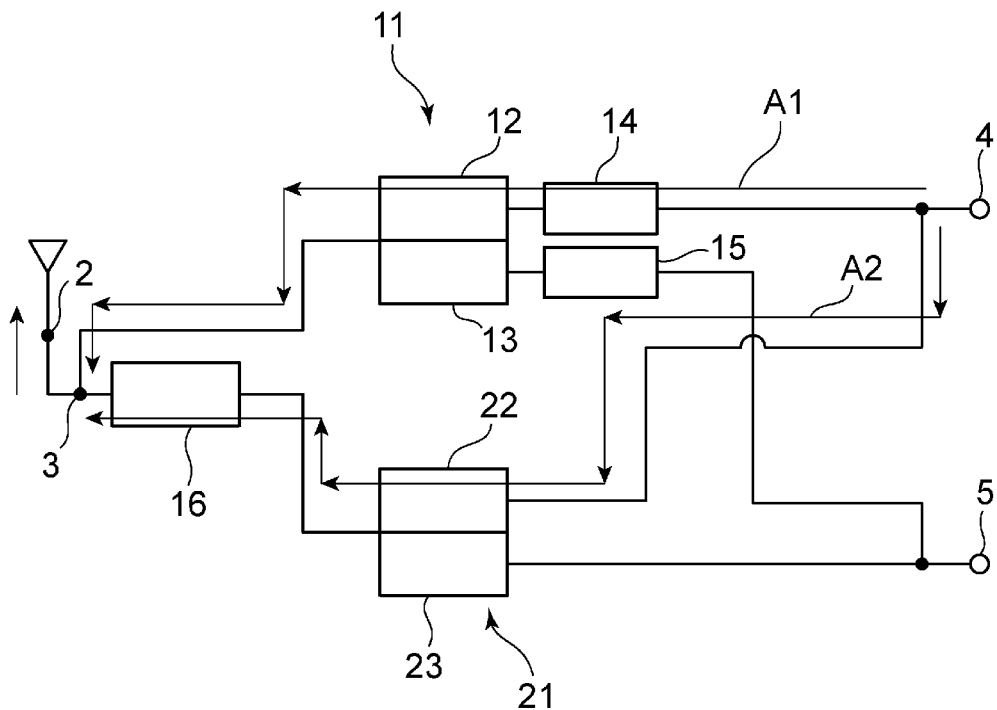
FIG. 12 is a circuit diagram for describing how a transmission signal of Band 77 is transferred in the composite multiplexer according to the first preferred embodiment of the present invention.

FIG. 12 is a diagram illustrating how the transmission signal of Band 77 is transferred toward the first terminal 3 from the second terminal 4 for Band 77. As indicated by an arrow A1, the transmission signal is transferred to the first terminal 3 via the first LC circuit 14 and the band pass filter circuit 12 of the first duplexer 11. In this case, the first LC circuit 14 delays the phase of the transmission signal by about 90 degrees.

As indicated by an arrow A2, the transmission signal of Band 77 is transferred to the first terminal 3 via the band pass filter circuit 22 and the second LC circuit 16 of the second duplexer 21. In this case, the second LC circuit 16 delays the phase of the transferred signal by about 90 degrees. At the first terminal 3, the phases of both of the transmission signals indicated by the arrow A1 and the arrow A2 are equal or substantially equal to each other. Thus, the signals propagated along both of the transfer paths are combined without canceling each other out and are output to the first terminal 3 and the antenna terminal 2.

Figure 13:
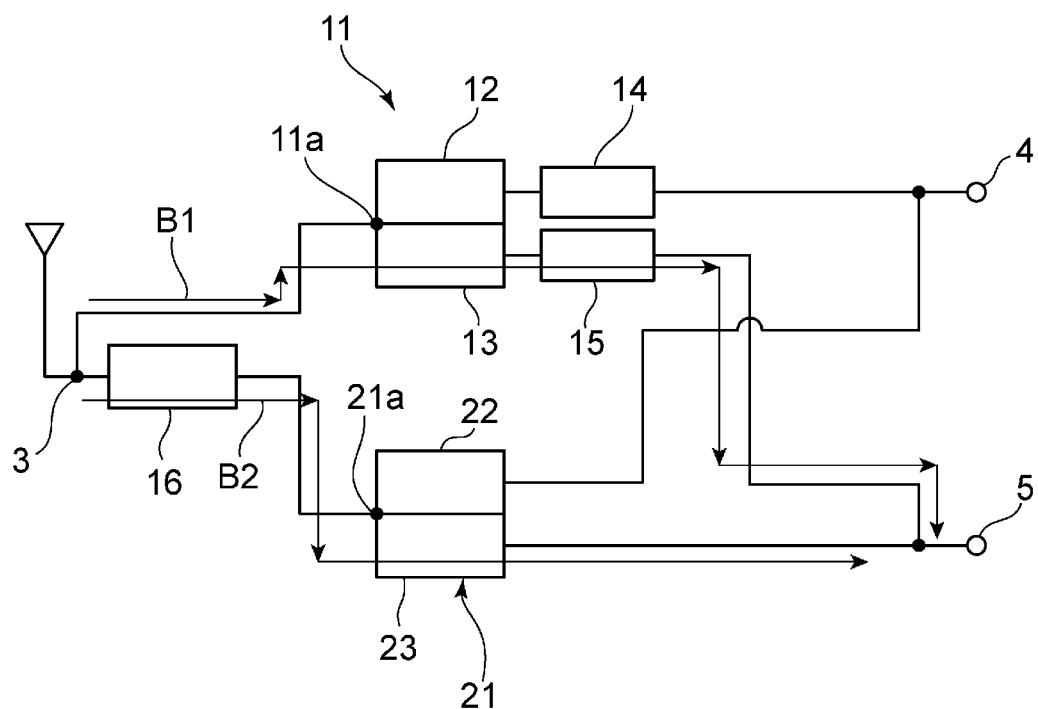
FIG. 13 is a circuit diagram for describing how a reception signal of Band 79 is transferred in the composite multiplexer according to the first preferred embodiment of the present invention.

As illustrated in FIG. 13, the reception signal of Band 79 is transferred from the first terminal 3 to the second terminal 5 for Band 79. In a transfer path indicated by an arrow B1, the reception signal passes through the band pass filter circuit 13 and the first LC circuit 15 of the first duplexer 11. Therefore, the phase of the reception signal is delayed by about 90 degrees. In a transfer path indicated by an arrow B2, the reception signal is transferred to the second terminal 5 via the second LC circuit 16 and the band pass filter circuit 23. In this case as well, the second LC circuit 16 delays the phase of the signal by about 90 degrees. At the second terminal 5, the phases of the signals transferred along the transfer path indicated by the arrow B1 and the transfer path indicated by the arrow B2 are equal or substantially equal to each other. Thus, the reception signals are combined without canceling each other out.

Figure 14:
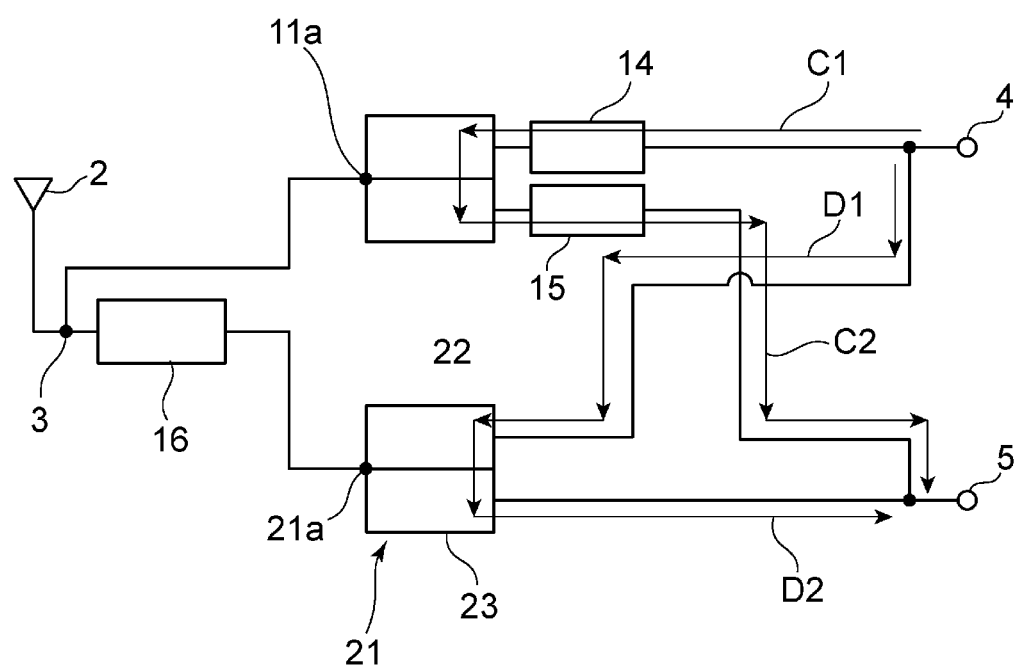
FIG. 14 is a circuit diagram for describing how an isolation signal is transferred in the composite multiplexer according to the first preferred embodiment of the present invention.

FIG. 14 illustrates isolation between the second terminal 4 for Band 77 and the second terminal 5 for Band 79. In transfer paths indicated by arrows C1 and C2, a signal leaking from the second terminal 4 toward the second terminal 5 passes through the first LC circuit 14 and the first LC circuit 15. Therefore, the phase is delayed by about 180 degrees. The phase of the signal leaking along transfer paths indicated by arrows D1 and D2 is not delayed. At the second terminal 5, the phase of the signal transferred along the transfer paths indicated by the arrows C1 and C2 and the phase of the signal transferred along the transfer paths indicated by the arrows D1 and D2 differ from each other by about 180 degrees. Thus, both the signals cancel each other out and the isolation characteristic is improved.

For the reason described above, the example demonstrates that the isolation characteristic between the second terminal 4 for Band 77 and the second terminal 5 for Band 79 is able to be effectively improved without deteriorating the transfer characteristic between the second terminal 4 and the first terminal 3 and the transfer characteristic between the second terminal 5 and the first terminal 3.

Figure 15:
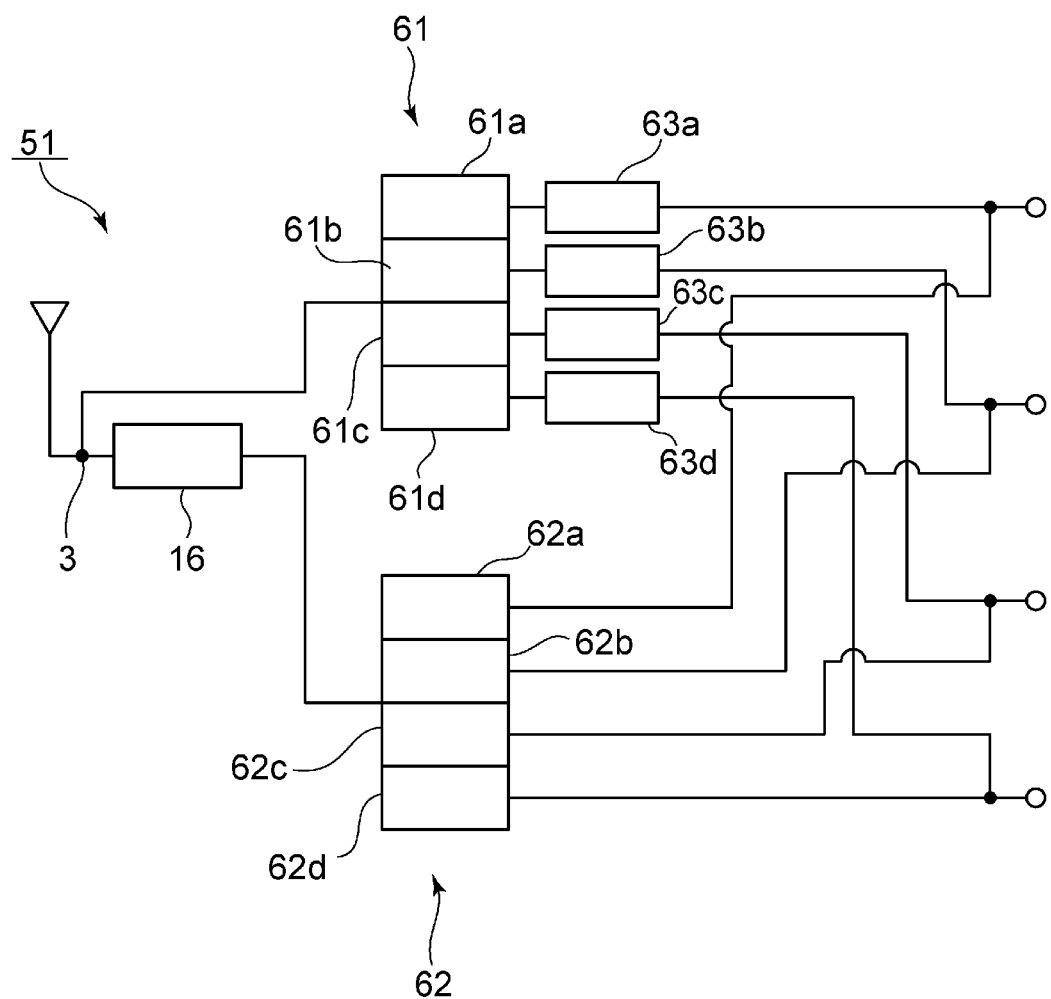
FIG. 15 is a circuit diagram of a composite multiplexer according to a second preferred embodiment of the present invention.

In the composite multiplexer 1 according to the first preferred embodiment, the first and second duplexers 11 and 21 are connected to the first terminal 3 in common. As in a composite multiplexer 51 according to a second preferred embodiment illustrated in FIG. 15, a first multiplexer 61 and a second multiplexer 62 may preferably be, for example, quadruplexers including four band pass filter circuits 61a to 61d and four band pass filter circuits 62a to 62d, respectively. In the first multiplexer 61, first LC circuits 63a to 63d are connected to the end portions of the band pass filter circuits 61a to 61d that are opposite to the first terminal 3, respectively. The second LC circuit 16 is connected between the second multiplexer 62 and the first terminal 3.

In preferred embodiments of the present invention, each of the first and second multiplexers is not limited to the duplexer, and may be a triplexer, a quadruplexer, or a multiplexer including five or more band pass filters, for example. When the number of band pass filters of a multiplexer is represented by N, first LC circuits are connected to N filters in the first multiplexer, respectively, and the second LC circuit 16 is connected between the first terminal 3 and the second multiplexer. When the number of band pass filter circuits of each of the first and second multiplexers is represented by N, a total of N+1 LC circuits are provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite multiplexer, comprising:
a first terminal to be connected to an antenna terminal;
a plurality of second terminals defining and functioning as input/output terminals;
a first multiplexer including:
  a plurality of first band pass filter circuits including one-side ends connected to the first terminal; and
  a plurality of first LC circuits connected to the plurality of first band pass filter circuits, respectively;
  end portions of the plurality of first band pass filter circuits that are opposite to the first terminal being connected to the plurality of second terminals with the first LC circuits interposed therebetween, respectively;
a second multiplexer including:
  a plurality of second band pass filter circuits including one-side ends connected to the first terminal;
  portions of the plurality of second band pass filter circuits that are opposite to the first terminal being connected to the plurality of second terminals, respectively; and
a second LC circuit connected between the first terminal and the second multiplexer; wherein
the one-side ends of the plurality of first band pass filter circuits and the one-side ends of the plurality of second band pass filter circuits that are connected to the first terminal are connected to each other in common;
the first multiplexer and the second multiplexer are connected in parallel to each other; the first multiplexer is connected in series between the first terminal and each second terminal; and the second multiplexer is connected in series between the first terminal and each second terminal.

2. The composite multiplexer according to claim 1, wherein at least one of the plurality of first and second band pass filter circuits is defined by an acoustic wave filter.

3. The composite multiplexer according to claim 2, wherein the acoustic wave filter includes a plurality of series arm acoustic wave resonators and a plurality of parallel arm acoustic wave resonators.

4. The composite multiplexer according to claim 3, wherein each of the plurality of series arm acoustic wave resonators and the plurality of parallel arm acoustic wave resonators includes a support substrate, an acoustic multilayer film stacked on the support substrate, a piezoelectric plate stacked on the acoustic multilayer film, and an interdigital transducer electrode provided on the piezoelectric plate.

5. The composite multiplexer according to claim 4, wherein the acoustic multilayer film includes low acoustic impedance layers and high acoustic impedance layers that are alternately stacked on each other.

6. The composite multiplexer according to claim 5, wherein the low acoustic impedance layers and the high acoustic impedance layers are made of an insulating material including silicon oxide, silicon oxynitride, silicon nitride, or alumina; a semiconductor material including silicon, or a metal material including Al, Pt, or an AlCu alloy.

7. The composite multiplexer according to claim 4, wherein the support substrate is made of a semiconductor material including silicon or a piezoelectric material including silicon oxynitride, silicon nitride, or alumina.

8. The composite multiplexer according to claim 4, wherein the piezoelectric plate is made of $LiTaO_3$ or $LiNbO_3$.

9. The composite multiplexer according to claim 2, wherein the acoustic wave filter uses an S0 mode of plate waves.

10. The composite multiplexer according to claim 1, wherein the first multiplexer is a first duplexer and the second multiplexer is a second duplexer.

11. The composite multiplexer according to claim 10, wherein
one of the plurality of first band pass filter circuits and one of the plurality of second band pass filter circuits are band pass filter circuits for an identical band; and
another one of the plurality of first band pass filter circuits and another one of the plurality of second band pass filter circuits are band pass filter circuits for another identical band.

12. The composite multiplexer according to claim 1, wherein the plurality of first LC circuits define attenuation poles defining pass bands of the band pass filter circuits.

13. The composite multiplexer according to claim 1, wherein the second LC circuit is a 90-degree delay circuit to delay a phase of a signal to be propagated by about 90 degrees.

14. The composite multiplexer according to claim 1, wherein each of the plurality of first LC circuits is a 90-degree delay circuit to delay a phase of a signal to be propagated by about 90 degrees.

15. The composite multiplexer according to claim 1, wherein
one of the plurality of first band pass filter circuits is for Band 77; and
another one of the plurality of first band pass filter circuits is for Band 79.

16. The composite multiplexer according to claim 1, wherein
one of the plurality of second band pass filter circuits is for Band 77; and
another one of the plurality of second band pass filter circuits is for Band 79.

17. The composite multiplexer according to claim 1, wherein at least one of the plurality of first band pass filter circuits is a ladder filter.

18. The composite multiplexer according to claim 1, wherein at least one of the plurality of second band pass filter circuits is a ladder filter.

19. The composite multiplexer according to claim 1, wherein each of the plurality of first band pass filter circuits is a ladder filter.

20. The composite multiplexer according to claim 1, wherein each of the plurality of second band pass filter circuits is a ladder filter.

* * * * *